United States Patent [19]

Crittenden et al.

[11] Patent Number: 5,400,343
[45] Date of Patent: Mar. 21, 1995

[54] APPARATUS AND METHOD FOR DEFECTIVE COLUMN DETECTION FOR SEMICONDUCTOR MEMORIES

[75] Inventors: Brent S. Crittenden, Phoenix; Ronald K. Minemier, Tempe, both of Ariz.

[73] Assignee: Intel Corporation, Santa Clara, Calif.

[21] Appl. No.: 843,525

[22] Filed: Feb. 28, 1992

[51] Int. Cl.⁶ .............................................. G11C 29/00
[52] U.S. Cl. ................................ 371/21.4; 371/21.1; 365/201
[58] Field of Search ............................ 371/21.4, 21.1; 365/201

[56] References Cited

U.S. PATENT DOCUMENTS

| | | | |
|---|---|---|---|
| 4,044,244 | 8/1977 | Foreman | 235/153 AC |
| 4,450,402 | 5/1984 | Owen, III | 324/73 R |
| 4,517,512 | 5/1985 | Petrich | 324/73 R |
| 4,595,875 | 6/1986 | Chan | 371/21.4 X |
| 4,701,695 | 10/1987 | Chan | 371/21.1 X |
| 4,719,411 | 1/1988 | Buehler | 324/73 R |
| 4,779,272 | 10/1988 | Kohda | 371/21 |
| 4,811,285 | 3/1989 | Walker | 364/45 |
| 4,841,482 | 6/1989 | Kreifels | 365/185 |
| 4,860,261 | 8/1989 | Kreifels | 365/218 |
| 4,999,813 | 3/1991 | Ohtsuka | 365/201 |
| 5,025,344 | 6/1991 | Maly | 361/88 |
| 5,060,230 | 10/1991 | Arimoto | 371/21.2 |
| 5,132,937 | 7/1992 | Tuda | 365/201 |
| 5,255,229 | 10/1993 | Tanaka | 365/201 |
| 5,255,230 | 10/1993 | Chan | 365/201 |
| 5,258,954 | 11/1993 | Furuyama | 371/21.1 X |
| 5,276,647 | 1/1994 | Matsui et al. | 371/21.1 |
| 5,298,433 | 3/1994 | Furuyama | 365/201 |
| 5,315,598 | 5/1994 | Tran | 371/21.1 |

*Primary Examiner*—Robert W. Beausoliel, Jr.
*Assistant Examiner*—Glenn Snyder
*Attorney, Agent, or Firm*—Blakely, Sokoloff, Taylor & Zafman

[57] ABSTRACT

A circuit and method are provided for a pad efficient and speed efficient test of column leakage currents in silicon memory devices. Memory circuits are blocked into memory bit planes associated with individual I/O pins. Adequate testing requires that each column in each bit plane be tested for charge leakage characteristics. Rather than switching between I/O pins to test memory blocks associated with given pins, the switching circuitry is implemented on the silicon and is selectively coupled to the outputs of the bit planes on the chip. A single high voltage analog output pin is provided for test observations. This eliminates the need to ramp the testing system's voltages up and down and avoids the problems of hot switching between I/O pins.

6 Claims, 4 Drawing Sheets

APPARATUS AND METHOD FOR DEFECTIVE COLUMN DETECTION FOR SEMICONDUCTOR MEMORIES

BACKGROUND OF THE INVENTION

1. Field of the Invention

The present invention relates generally to the field of testing memory circuits on integrated circuits, both stand-alone and embedded. More particularly, the present invention relates to a pad efficient and speed efficient method and apparatus for testing for column leakage characteristics in semiconductor memory devices.

2. Description of the Prior Art

From a practical standpoint, there are two conditions which must be satisfied in order for VLSI circuit fabrication to continue to be a useful, burgeoning technology. First, the fabricated circuits must be capable of being produced in large quantities at costs which are competitive with alternative methods of achieving the same circuit and system functionality. Second, the circuits must be capable of performing their functions throughout their intended useful life.

In order to deal successfully with these two requirements, various methods have been developed to identify the diverse mechanisms which seriously limit the yield and reliability of VLSI circuits. Likewise, prodigious attempts have been made at developing accurate yield and reliability modeling parameters to enable the manufacturer of VLSI circuits to better predict the reliability of products. Economically, it is very critical for the circuit fabricator to be able to detect those integrated circuits of a certain class which are unreliable due to a particular type of reliability failure mechanism.

Ideally, in a properly fabricated wafer of integrated circuits, one would expect all of the circuits to be good functional devices. However, in practice, the number of good circuits per wafer may range anywhere from 0 to 100%, depending on the process employed and the relative complexity of the circuit. The causes for less than perfect yield often depend on the category or class of integrated circuits which are being fabricated. For instance, low yield and reliability may be due to systemic processing problems, circuit design problems or random point defects in the circuit.

One class of integrated circuits contain floating-gate memory devices which utilize hot electron injection to add electrons to, and "FOWLER-NORDHEIM" tunneling to remove electrons from floating gates. Such ICs are often called EEPROMs, E$^2$PROMSs, flash EPROMs, or non-volatile memories. It must be noted that not all flash memories employ the electron tunneling mechanism and that each non-volatile class has its own unique characteristics. Floating gate cells which rely on tunnelling may also be used in other types of integrated circuits as well.

One type of failure that has plagued memory devices in the past is excessive column leakage, hereinafter referred to as leaky columns. Leaky columns can be caused by a number of failure mechanisms, including the following: 1) resistive shorts from the column metal to the wordline, adjacent columns or ground straps; 2) negative electrical erase thresholds due to overerase; 3) spiked column drain contacts; and 4) defects in the bulk silicon shorting either the source to the drain or the source or drain to the substrate. Several of these defects are latent, can degrade over time, or through later processing. Flash memories have suffered from dual column shorts during cycling while-EPROMs have seen speed shifting in burn-in due to junction spiking.

As is appreciated by the practitioners in the art, column leakage characteristics can dramatically affect correct data output in memory devices and/or access speed degradation. Non-volatile memories should be able to withstand numerous program/erase cycles of the integrated circuit. The ability of a silicon memory device to survive such cycling is called the chip's "reliability" or "endurance". An IC failing after a given cycling operation is frequently referred to as suffering "endurance failure".

Note the term "reliability" as used in this context, refers to the probability that an IC will perform a required function for a stated period of time. For floating gate memory device, the "required function" is generally defined as its ability to cycle a given number of times. For example, properly fabricated EEPROMs and flash EPROMs are generally expected to cycle anywhere between 10,000 and 100,000 times before experiencing endurance failure.

For memory circuits it is therefore desirable to screen for columns that show any charge leakage characteristics. In some memory technologies, single column measurements must be made with nano-amp accuracies. Locating a single defective column out of the several thousand that may make up the total memory array can take many seconds of test system time. Test system time on modern VLSI testers represents an increasing fraction of the total cost of a product.

The standard method for testing for columns that show leakage characteristics is to use the chip tester's Precision Measurement Unit (PMU). First, the PMU is usually initialized to zero volts to avoid 'hot switching' the pins that will later be attached to the unit. The second step is then to select a pin or group of pins to be switched from their channel driver circuits onto the PMU circuit; the tester controls this switching under tester program commands. The PMU is then set to the forcing voltage and after some delay, a measurement is made. Subsequent tests usually require a reverse of the set-up process; the PMU is forced back to the 'safe' state and the pins disconnected, then new pins are connected and the PMU forced back to the measurement voltage. This PMU manipulation and pin selection make up the bulk of the tester time to actually execute the desired test.

There is also a limitation for adding and subtracting pins to the PMU due to the AC loading effects of the device under test. Some test heads have very large capacitances associated with each pin. Pin capacitance of over 100 pF are not unusual. Switching large capacitances requires time for settling and setup, thus increasing the total time needed to complete stable low current noise-free measurements. The switching mechanism for bit plane output pins, to the tester channels, are electromechanical relays.

Each bit plane has its digital data output as well as an analog output line. For testing, a test voltage is applied across the rows of the memory array. Current measurements of either the whole bit plane's analog output or individual columns are then measured to detect column leakage. The analog output current must be precisely measured to accurately determine column leakage characteristics. Too much measured current indicates a leaky column and likely a bit plane or device that will not live up to its endurance requirements.

In order to test for column leakage, it is necessary to apply a predetermined test voltage across the word lines of the memory array. U.S. Pat. Nos. 4,841,482 and 4,860,261, assigned to the assignee of the present invention, disclose circuitry and a method for accomplishing this necessary task in the case of flash EPROMS. Those patents are incorporated herein by reference. Another U.S. Pat. No. 4,963,825, assigned to the assignee of the present invention discloses a method of testing cells in a flash memory array for charge leakage from the floating gates of the transistors that make up the memory cells.

SUMMARY OF THE INVENTION

The present invention provides a method and apparatus for efficient testing of column leakage characteristics in semiconductor memory devices. The switching functions that normally reside in the test system are moved from the test system and incorporated into the device under test. That is, the switching of the memory bit plane outputs will be accomplished on the silicon with only one analog I/O line brought out of the memory to an analog output pad for observation by a test system.

It is an object of the present invention to eliminate the need to switch large capacitances on and off to a single PMU during measurements. PMU settling time will be greatly reduced saving a significant time per device tested.

It is also an object of the present invention to obtain a very noise-free environment for the test measurements which is provided by on-chip switching rather than the noisier electro-mechanical switching of I/O pins. This allows for for precise measurements to be made and at higher device clock speeds.

It is a further object of the present invention to be able to leave the PMU in its forcing 'on' state. The PMU up/down ramp times will be eliminated with a very large savings in test times for multiple column screening tests.

It is also an object of the present invention to decrease the amount of time required for testing. This results from the elimination of the electro-mechanical switching device in favor of on-chip switching.

It is still a further object of the present invention to provide a way to apply a stressing voltage to the memory bit planes without the addition of circuitry other than that needed for testing.

These and other objects of the present invention will be described more fully with reference to the following drawings.

DETAILED DESCRIPTION OF THE INVENTION

A circuit and a method for a pad efficient and speed efficient verification of column charge leakage in semiconductor memory devices are described. In the following description, numerous specific details are set forth, such as specific circuit configurations, components, etc. in order to provide a thorough understanding of the present invention. It will be obvious, however, to one skilled in the art that the present invention may be practiced without these specific details. In other instances, well-known processes, circuits, and control lines have not been described in detail in order not to unnecessarily obscure the present invention.

In the fabrication of memory chips and modularized integrated circuits containing embedded memories, it is necessary to test the memories for both complete failure as well as for charge leakage conditions which will decrease the lifetime for a given chip. A predetermined test voltage is applied across the rows of the memory device and the PMU of a testing system is used to measure for current above an allowable threshold to identify columns or bit planes that show excessive column charge leakage characteristics. The method and apparatus for applying the predetermined voltage to the rows of the memory array are described fully in U.S. Pat. Nos. 4,841,482 and 4,860,261 assigned to the assignee of the present invention. Those patents show a circuity and method for applying a predetermined test voltage across word lines in flash EPROM-type memory arrays and will work for embedded flash memories like those for which the present invention is used in accordance with a preferred embodiment. Those of ordinary skill in the art will recognize that there are numerous ways of applying a test voltage to memory devices. The present invention is concerned with efficiently looking at the column effects generated by such inputs.

In many situations discussed below, reference is made to applying the present invention to flash memory devices, which is in accordance with a preferred embodiment of the present invention. Those skilled in the art will appreciate that the present invention is easily applied to any semiconductor memory device from which column current measurement is desired. Its application is not limited to flash memories, nor even necessarily to those that are fabricated out of silicon.

Figure 1:
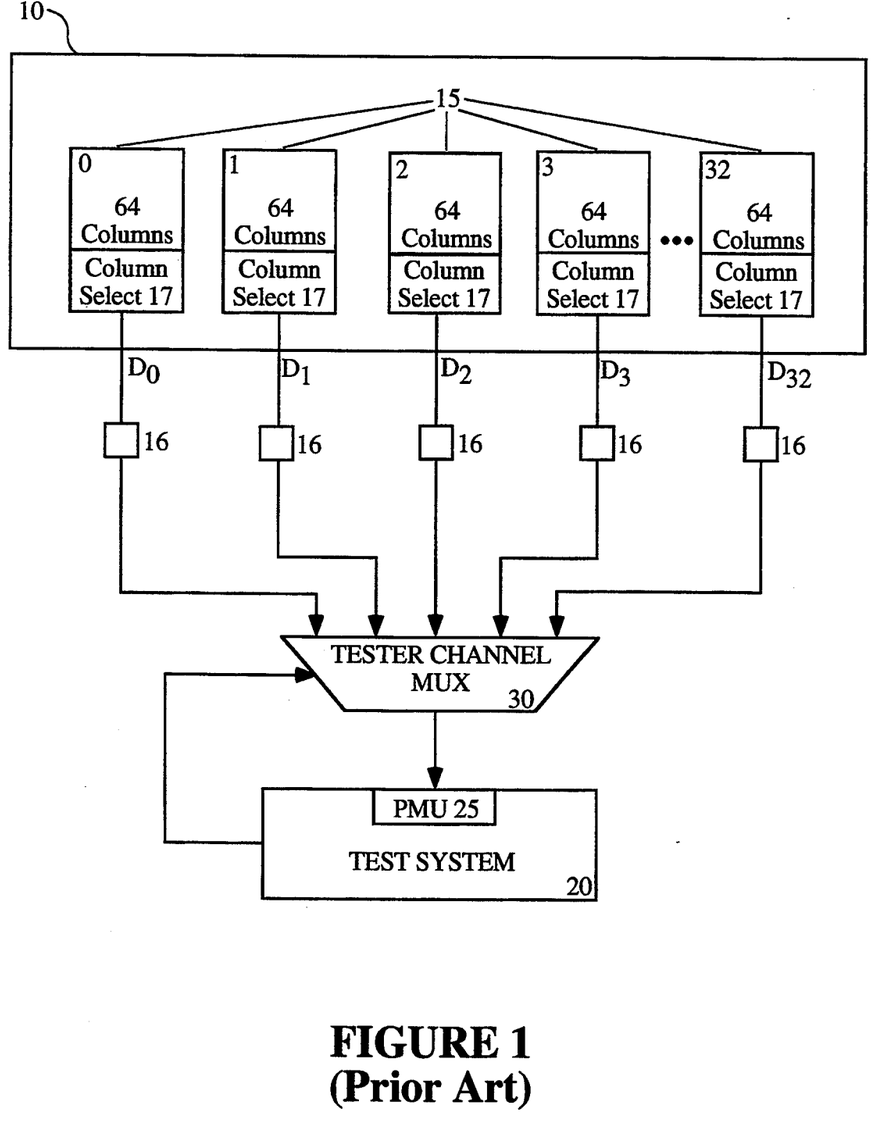
FIG. 1 is a logic diagram of a prior art approach to testing multiple columns for leakage in semiconductor memory devices from multiple I/O pins.

Referring first to FIG. 1, a portion of an integrated circuit 10 comprising a non-volatile memory array is shown configured for leaky column detection in a manner in accordance with the prior art. The memory configuration of concern with the present invention is a flash-type nonvolatile memory having 2048 columns. These columns will be divided among 32 data pins, each thus having associated with it 64 columns. This grouping of columns into 64 columns associated with each data pin 16 will be referred to as the 32 bit planes 15 of the memory device. Each bit plane 15 is that collection of columns associated with a given I/O pin 16.

While both the prior art method of leaky column detection and the present invention will work for testing memory devices with any column configuration, the 32-bit-plane memory device will be used to help emphasize the great advantages of the present invention. As noted, each bit plane 15 (5 of the thirty-two are shown in FIG. 1) will contain 64 memory columns. Each bit plane 15 will also have associated with it circuitry referred to as the column select logic 17. The column select logic 17 receives an address identifying which column from the bit plane 15 is to be output to the associated I/O pin 16. The column select logic 17 is also capable of outputting the analog signal from a given column as an alternative to the digital output that is usually seen at the output pins 16. The types of column select logic for selecting desired columns in a given bit plane 15 are well-known to those skilled in the art.

It is the analog signal from the bit plane 15 that must be measured in order to detect for column leakage characteristics. Measuring the digital output will only reveal an absolute failure, whereas measuring the analog output will determine a propensity for column failure during the expected lifetime of the device. A predetermined test voltage is applied to the word lines of the device (not shown) according to the two reference patents discussed above. The analog output of the column is then measured for a current level below an acceptable level, about 200 nA - 10 nA in the preferred embodiment. The presence of such a current is indicative of leaky column failures.

The currents to be detected can be on a nano-amp scale, as low as 200 nA. To measure for such low currents, the Precision Measurement Unit of the tester is used. The tester in the prior art configuration will have pin connections for each of the I/O pins 16 of the memory device on the integrated circuit. The connections on the tester will be processed through a tester channel multiplexer 30. The tester channel multiplexer 30 in the standard prior art configuration is a collection of electro-mechanical relays which receive the outputs from each of the I/O pins 16 and selectively chooses one at a time for observation by the PMU. After all the columns in a given bit plane 15 have been tested, it is necessary to switch to receive the output from another of the chip's I/O pins. To avoid "hot switching" between pins, the tester must reset the applied voltage to zero volts, then switch to the next desired output pin 16, then ramp back up to the applied test voltage of about 1.5 V. The selection of which I/O pin 16 to observe is controlled by the tester's software. The time it takes to do the above procedure in addition to the pin switching times adds up to be a large amount of the total tester time. The time it takes to ramp to a desired voltage is a function of the large capacitances encountered when switching between I/O pins 16. Also, the electro-mechanical switching relays create a lot of electrical noise which can degrade the sensitivity of the tester.

Another disadvantage of the external switching multiplexer 30 of the prior art is that all the analog lines from each bit plane 15 have to be routed through to the device's output pins 16. While this may not pose a serious problem where there are relatively few bit planes, such as the common 8-bit size, for wider arrays encompassing more bit planes, such as the 32 in the preferred embodiment of the present invention, the wiring problems are greatly increased. The greater the number of bit planes 15, and thus I/O memory outputs 16, the more critical the wiring concerns become. Also, the time demand problems with the above method are exacerbated as the number of bit planes 15 to switch to increases.

Figure 2:
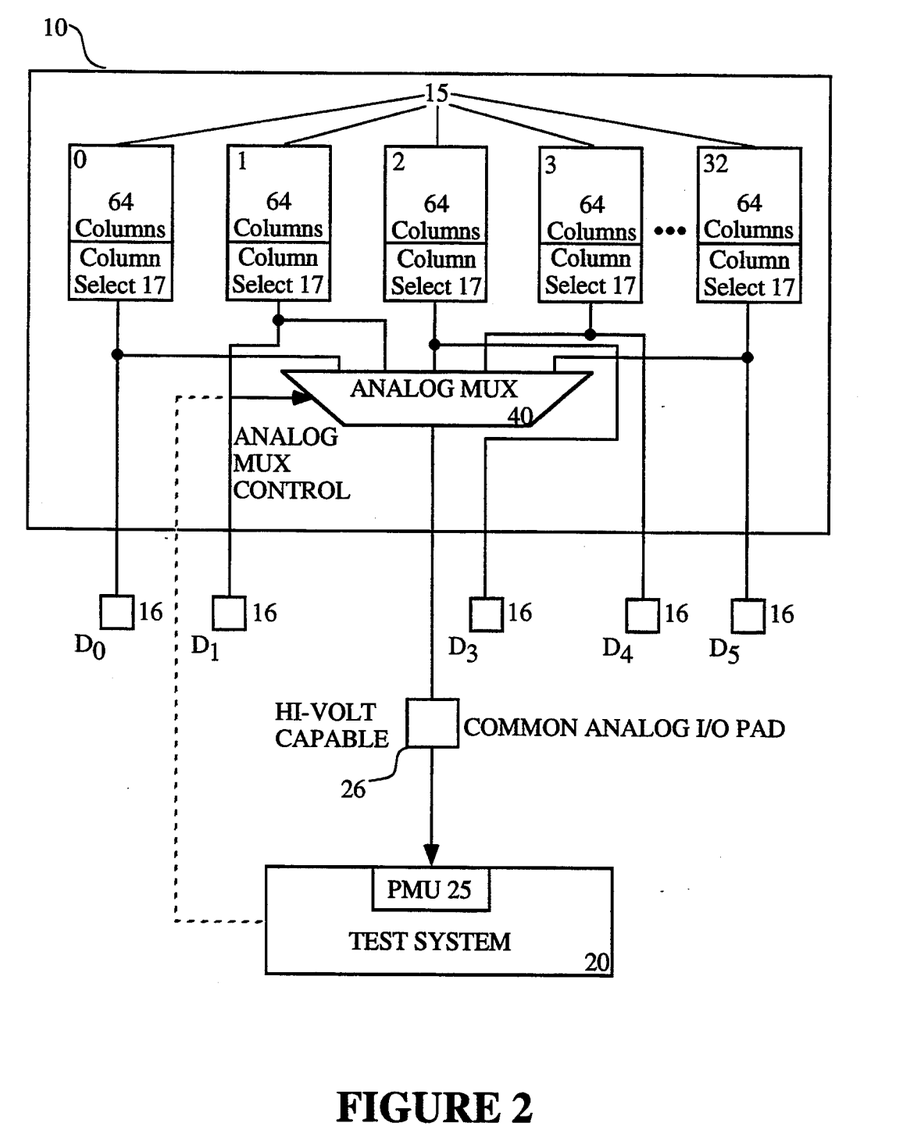
FIG. 2 is a logic diagram of a preferred embodiment of the present invention where the switching mechanism has been implemented on the silicon substrate on which the memory device has been fabricated.

FIG. 2 shows the a logic circuit implementation in accordance with a preferred embodiment of the present invention for greatly increasing tester efficiency. As can be seen, the electro-mechanical multiplexer 30 from FIG. 1 has been eliminated. Instead, an analog multiplexer 40 is implemented in the silicon as part of the semiconductor device. In the preferred embodiment, the 32 analog output lines from the 32 bit planes 15 (only five are shown in FIG. 2) are easily routed within the silicon to the on-board analog multiplexer logic 40. This eliminates the need to switch between the 32 data output pins 16 during testing. It also alleviates the problem of having to route 32 analog lines out of the chip in addition to the digital data lines.

Because the analog multiplexer is implemented on the tested device itself, the switching speeds are greatly increased from the electro-mechanical switching speeds of the prior art. Further, it is not necessary to route all the lines directly to their associated outputs 16. The analog multiplexer 40 is coupled so a single high-voltage capable analog output pad 26. This single analog line is then coupled through the chip tester 20 to the tester's PMU 25. A further advantage of doing the switching in an on-chip analog multiplexer is that there are no "hot switching" problems and practically no noise problems. Thus, the memory columns can be tested at high speed and no time is lost for switching or capacitance settling.

The on-chip analog multiplexer 40 is controlled by input signals that are generated by the test software running on the tester. This may be directly coupled to the multiplexing logic 40 through a test input on a stand-alone memory, or via an on-chip microprocessor in the case of embedded memories. The software in the tester is capable of selecting a whole bit plane at a time to test, one column at a time within the bit plane, or other configurations of columns. Integrated circuit tester's with built-in PMUs are well-known in the art and will not further be described herein.

The use of a common analog I/O pad 26 provides a number of great advantages over the prior art. If the normal data I/O pads 16 are used, voltages of Vcc (operating voltage of the chip, 5.5 V) would be the maximum voltage that could be applied back into the memory. But here, a higher voltage may be applied back through the analog pad 26, through the analog multiplexing logic 40 and applied to the memory columns. This provides a mechanism for stressing the memory device without the addition of more hardware. It is usually desirable to test for leaky columns, then to stress the columns by applying a higher voltage of 12 V, then to test for leaky columns again. This provides the best evidence of whether the device will survive for its intended lifetime. Also, the use of a single pad for testing minimizes the amount of wiring that must be laid within the chip which becomes critical as memory arrays and data buses get wider.

The I/O pad 26 that is used for observing the single analog output need not be dedicated to the purpose of testing. It may be selectively coupled for the purpose of testing while the chip is being tested and used for an entirely different purpose by the end-user of the product.

Figure 3:
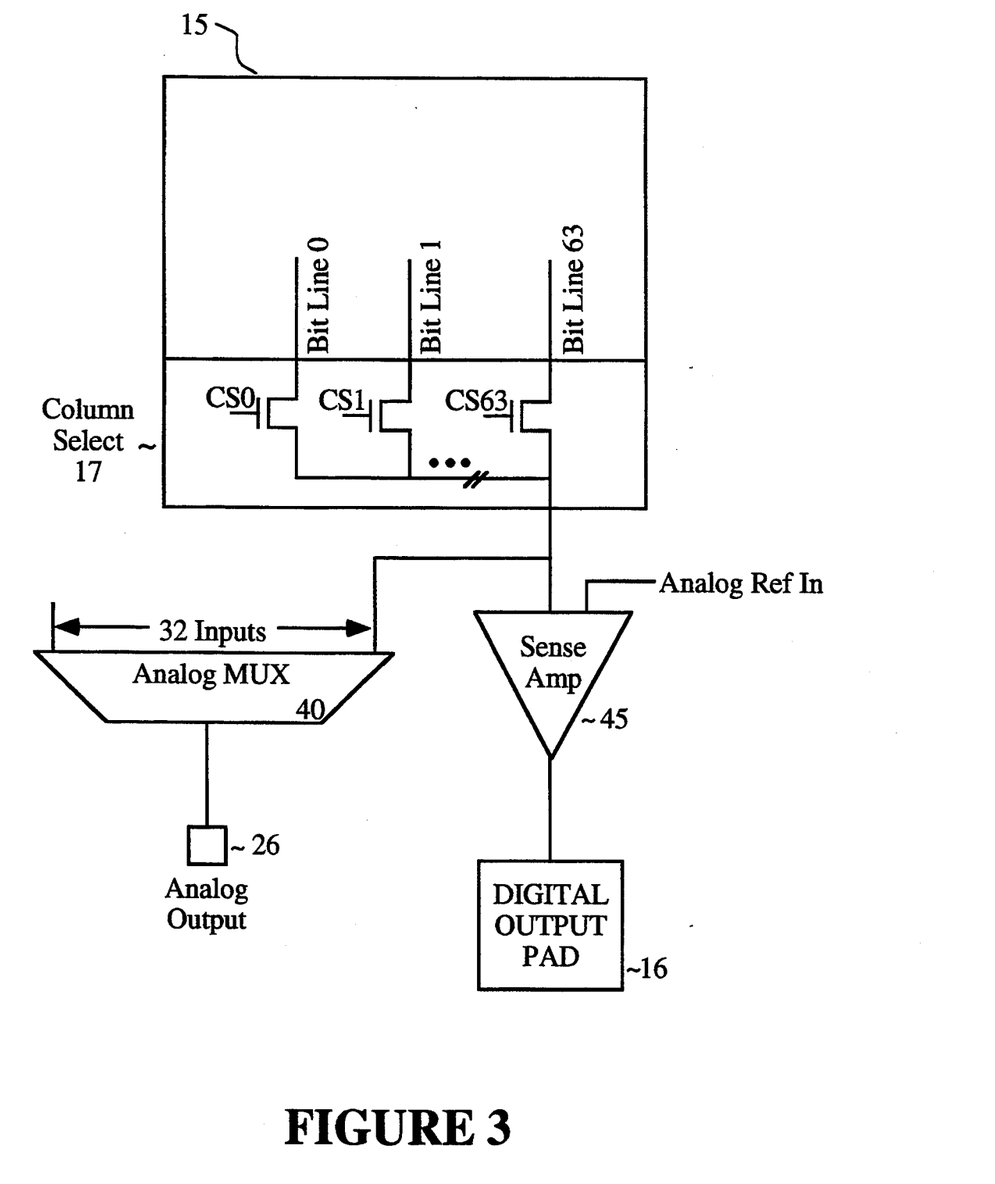
FIG. 3 is a detailed view of the silicon-implemented circuitry that outputs column leakage currents to a single analog output pad as it has been employed in a preferred embodiment in accordance with the present invention.

Referring next to FIG. 3, a more detailed circuit diagram of a portion of the memory column leakage test circuitry in accordance with a preferred embodiment of the present invention is shown. A portion of a single bit plane 15 is shown with three of its 64 bit lines illustrated. The bit plane 15 is coupled for both leaky column test output and ordinary data output. At the base of the bit plane 15 is the column select logic 17 which in the preferred embodiment comprises column select transistors CS0 to CS63. The transistors are used to select which column's current will be output for data transfer or test measurement. The switching of these transistors can be controlled either directly from the tester's software or indirectly through the chip's processor if the particular integrated circuit has one.

The output of the bit plane 15 is coupled to to both the analog multiplexer 40 and a sense amp 45. During ordinary operations, when the chip is not being tested, the sense amp 45 receives the bit plane's output and, based on an analog reference signal, will output either a high or a low logic signal to the bit plane's associated output pad 16. During memory testing operations, the sense amp 45 receives a reference signal which results in a zero volt output to the output pad 16.

When testing for column charge leakage characteristics in a given bit plane 15, the usual method is to gang test all of the bit plane's columns. This is done by activating all 64 of the column select transistors CS0-CS63. Again, the activating of these column select transistors is controlled by the tester's software. The test voltage is then applied across the rows of the memory array as described above. The bit plane's analog output is then routed to the analog multiplexer 40 without having been operated on by the sense amp 45. The tester's software controls the multiplexer 40 and selects the particular bit plane's output to pass to the analog test output pad 26. If no leakage current is detected during the gang test, then there is little need to test the columns individually. However, if a leakage current above 200 nA - 10 nA is detected the tester will configure the memory array outputs, via activating one column select transistor at a time to test one column at a time. Once a leaky column is detected it may be electrically replaced with a redundant column if any are provided or a decision may be made to discard the whole device.

As indicated above, the present configuration for testing for memory column leakage also provides a mechanism by which the memory arrays may be stressed. That is, the analog output pad 26 provides direct access to the memory columns without the sense amp 45 intervening. The sense amp changes the analog input to a digital voltage of Vcc or Vss. Any analog information is lost at that time. Thus, while a voltage of Vcc would be the maximum that could be passed back through the sense amp 45 from a data pin 16, a much higher voltage, on the order of 12 volts, may be applied directly to the memory columns via the analog output pad 26 without having to provide additional hardware. The stressing potential should be held across the memory columns for a period of time adequate to ensure sufficient stressing of the array, from 10 mS to 1 S. The analog multiplexer 40 would be controlled to isolate particular bit planes 15 for stressing in the same way that it is controlled for testing.

Figure 4:
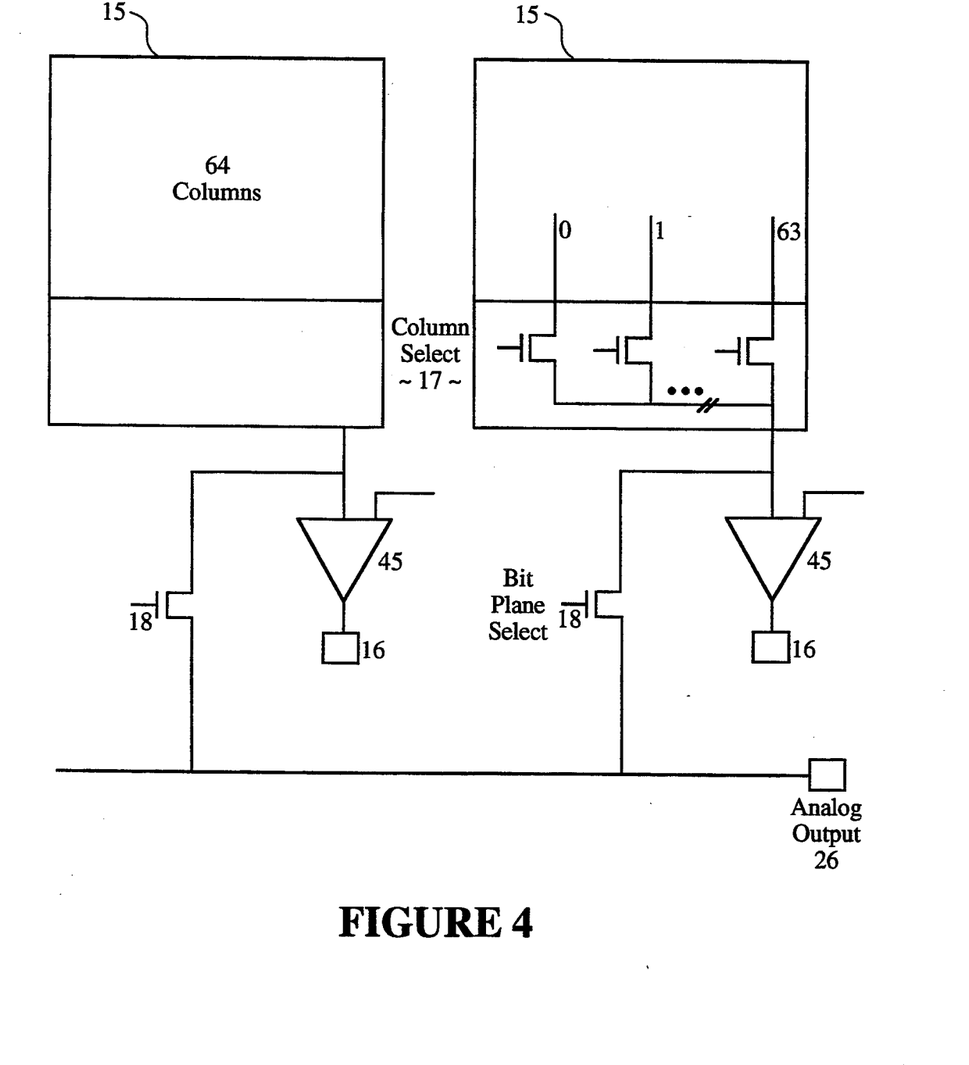
FIG. 4 is a circuit diagram of a simplified form of the analog multiplexing means for routing column leakage currents out through a single analog output.

The analog multiplexer 40 may be of any design that is well known in the prior art. It need only be capable of receiving a plurality of analog signals and selectively routing one of them to the analog output pad 26. FIG. 4 shows one simple configuration where the analog output line from each bit plane is switched on or off by a bit plane select transistor 18 which would be controlled from the software on the chip tester. Each of the bit planes' analog outputs would be selectively coupled in this manner to a common analog wire that routes the current to the test output pad.

Whereas many alternatives and modifications of the present invention will no doubt become apparent to a person of ordinary skill in the art after having read the foregoing description, it is to be understood that the particular embodiments shown and described by way of illustration are in no way to be considered limiting. Reference to the details of the preferred embodiment are not intended to limit the scope of the claims which themselves recite only those features regarded as essential to the invention.

What is claimed is:

1. A non-volatile semiconductor memory fabricated on a silicon substrate and employing a plurality of non-volatile memory cells arranged in an array of rows and columns wherein each column is associated with one of a plurality of bit planes, each of said bit planes having an analog line selectively coupled to the columns making up a given bit plane, said non-volatile semiconductor memory being capable of receiving an applied test voltage across all of said rows, an improvement for verifying column leakage characteristics comprising:

an analog multiplexer fabricated on said substrate and coupled to receive as input signals each of the analog lines from each of said plurality of bit planes, said analog multiplexer further being coupled to receive control signals for selecting which of said analog input signals to output, said analog multiplexer providing an analog output signal such that a current measuring device coupled to said analog output signal measures leakage current from a selected column if said selected column is subject to current leakage.

2. The improvement of claim 1 further comprising a high-voltage output pad coupled to said analog multiplexer for receiving the selected output from said analog multiplexer and providing an observation point for said current measuring device to measure for charge leakage characteristics.

3. The improvement of claim 1 wherein said analog multiplexers means comprises:

an analog output signal line selectively coupled to the analog lines of said plurality of bit planes; and
a plurality of switching transistors coupled between said analog output signal line and said plurality of bit planes for selecting which bit planes output will be passed to said analog output signal line.

4. A method of screening an integrated circuit for memory column charge leakage characteristics, said integrated circuit having an array of rows and columns of non-volatile memory cells, said method comprising the steps of:

applying a potential to the rows of said array of non-volatile memory cells;
selectively coupling at least one of said columns of said array of non-volatile memory cells through a silicon implemented analog multiplexer to an output pad on said integrated circuit; and
measuring the output current at said output pad to determine if a selected column exhibits charge leakage characteristics by having a current above an allowable threshold.

5. The method of claim 4 further comprising the step of iteratively repeating said steps for screening said integrated circuit for memory column charge leakage until every column of said memory array of memory cells has been measured for charge leakage characteristics.

6. A method for stressing a non-volatile memory array, having a plurality of rows and columns on an integrated circuit comprising the steps of:

applying a potential substantially greater than the operating voltage of the integrated circuit to a high-voltage capable pad of the integrated circuit;

selectively coupling electrically said pad through an on-chip analog multiplexer to the desired columns of said non-volatile memory array; and holding said potential across said desired columns of said non-volatile memory array for a predetermined period of time, thereby stressing said non-volatile memory array.

* * * * *

UNITED STATES PATENT AND TRADEMARK OFFICE
CERTIFICATE OF CORRECTION

PATENT NO.   :   5,400,343
DATED        :   March 21, 1995
INVENTOR(S)  :   Crittenden et al.

It is certified that error appears in the above-identified patent and that said Letters Patent is hereby corrected as shown below:

In column 2 at line 1 delete "while-EPROMs" and insert --while EPROMs--

In column 8 at line 36 delete "multiplexers means" and insert --multiplexer--

In column 8 at line 41 delete the second occurrence of "planes" and insert --plane's--

In column 8 at line 64 delete "columns" and insert --columns,--

Signed and Sealed this

Fifth Day of November, 1996

Attest:

BRUCE LEHMAN

*Attesting Officer*      *Commissioner of Patents and Trademarks*